(12) United States Patent
Jang

(10) Patent No.: US 6,649,979 B2
(45) Date of Patent: Nov. 18, 2003

(54) METHOD OF MANUFACTURING MOSFET AND STRUCTURE THEREOF

(75) Inventor: Wen-Yueh Jang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/005,624

(22) Filed: Dec. 4, 2001

(65) Prior Publication Data

US 2003/0042568 A1 Mar. 6, 2003

(30) Foreign Application Priority Data

Sep. 6, 2001 (TW) ........................... 90122078 A

(51) Int. Cl.[7] .................. H01L 27/01; H01L 27/12; H01L 31/113
(52) U.S. Cl. ............... 257/347; 257/351; 257/365; 257/377
(58) Field of Search ................. 257/347, 351, 257/365, 377; 438/149, 151, 197

(56) References Cited

U.S. PATENT DOCUMENTS

| | | | | | |
|---|---|---|---|---|---|
| 5,510,648 | A | * | 4/1996 | Davies et al. | 257/335 |
| 5,600,168 | A | * | 2/1997 | Lee | 257/336 |
| 5,726,479 | A | * | 3/1998 | Matsumoto et al. | 257/344 |
| 5,739,057 | A | * | 4/1998 | Tiwari et al. | 438/172 |
| 5,757,038 | A | * | 5/1998 | Tiwari et al. | 257/192 |
| 5,818,098 | A | * | 10/1998 | Davies et al. | 257/377 |
| 5,932,913 | A | * | 8/1999 | Hsu | 257/347 |
| RE36,314 | E | * | 9/1999 | Yamazaki et al. | 257/57 |
| 6,037,639 | A | * | 3/2000 | Ahmad | 257/401 |
| 6,054,386 | A | * | 4/2000 | Prabhakar | 438/149 |
| 6,228,691 | B1 | * | 5/2001 | Doyle | 438/149 |
| 6,242,759 | B1 | * | 6/2001 | Yamazaki et al. | 257/351 |
| 6,246,532 | B1 | * | 6/2001 | Hori | 359/813 |
| 6,259,142 | B1 | * | 7/2001 | Dawson et al. | 257/318 |
| 6,316,294 | B1 | * | 11/2001 | Yoon et al. | 438/149 |
| 6,335,214 | B1 | * | 1/2002 | Fung | 438/197 |
| 6,359,311 | B1 | * | 3/2002 | Colinge et al. | 257/347 |
| 6,384,452 | B1 | * | 5/2002 | Chittipeddi et al. | 257/347 |
| 6,387,739 | B1 | * | 5/2002 | Smith, III | 438/157 |
| 6,392,271 | B1 | * | 5/2002 | Alavi et al. | 257/302 |

* cited by examiner

*Primary Examiner*—Wael Fahmy
*Assistant Examiner*—Shrinivas H Rao
(74) *Attorney, Agent, or Firm*—J.C. Patents

(57) ABSTRACT

A method of manufacturing an MOSFET. A substrate is provided. A trench filled with an insulating layer is formed in the substrate. The upper portion of the insulating layer is removed and then a spacer is formed on the side-wall of the trench. A sacrificial layer is formed to fill the trench. A doped semiconductive layer is formed over the substrate and then patterned to form a device region, wherein the device region spans the sacrificial layer to expose a portion of the sacrificial layer. The sacrificial layer is removed. A gate dielectric layer is formed on the exposed surface of the device region. A conductive layer is formed on the gate dielectric layer and then patterned to form a horizontal surround gate surrounding the device region. A source/drain region is formed in a portion of the substrate adjacent to the device region.

15 Claims, 6 Drawing Sheets

METHOD OF MANUFACTURING MOSFET AND STRUCTURE THEREOF

CROSS-REFERENCE TO RELATED APPLICATION

This application claims the priority benefit of Taiwan application serial No. 90122078, filed Sep. 6, 2001.

BACKGROUND OF THE INVENTION

1. Field of Invention

The present invention relates to a structure of a semiconductor device and a method for manufacturing the semiconductor device. More particularly, the present invention relates to a structure of a MOSEFT and a method for manufacturing the MOSEFT.

2. Description of Related Art

With the gradually shrunk line width of the MOS, the leakage occurs easily at a portion of the source/drain far from the gate. The leakage can be decreased by forming a gate dielectric layer with a relatively thin thickness. However, when the line width is shrunk down below 0.1 micron, even the extremely thin gate dielectric layer cannot block the leakage. In order to solve the problem mentioned above, Professor Chenming Hu in UC Berkeley suggests two solutions. One is to use a substrate with a relatively thin thickness in the formation of the MOSFET. Therefore, there is no conductive path far from the gate. The other solution is to form a MOSFET with a double-gate structure surrounding the channel region so that the whole channel region is well controlled by the gate electric field. Hence, the on-current is increased and the leakage is decreased.

According to the concepts provided by professor Hu, a fin-type field effect transistor (FET) is developed. FIGS. 1A through 1C are schematics of the structure of a fin-type FET, wherein FIG. 1B is a cross-sectional view of a portion of FIG. 1A along line I–I' and FIG. 1C is a cross-sectional view of a portion of FIG. 1A along line II–II'. The method for manufacturing the fin-type FET comprises the steps of providing a silicon-on-insulator (SOI) substrate 100. The thickness of the silicon layer (not shown) on the insulation layer 105 is 100 nm. Then, the thickness of the silicon layer is scaled down to 50 nm by performing the thermal oxidation. A hard mask layer 110 made of low temperature oxide (LTO) is formed on the silicon layer. A photolithography with a 100 keV electron beam and an anisotropic etching process are performed to pattern the hard mask layer 110 and the silicon layer to form a fin-type silicon layer 120 with a width about 20~50 nm. A poly Si—Ge layer (not shown) and a hard mask layer 130 made of LTO are subsequently formed over the substrate 100. The hard mask layer 130 and the poly Si—Ge layer are patterned to form a raised source 140 and a raised drain 150 with a thickness far larger than fin-type silicon layer 120.

As shown in FIG. 1A together with FIGS. 1B and 1C, a conformal silicon nitride layer (not shown) is formed over the substrate 100. An anisotropic etching process is performed to pattern the conformal silicon nitride layer into a spacer 160. In the anisotropic etching process, an over-etch step is performed even after a portion of the silicon nitride layer over the hard mask layer 130 is completely removed. Thus, a spacer formed on the side-wall of the fin-type silicon layer 120 with a relatively small thickness is totally removed but spacers 160 formed on the side-walls of the raised source 140 and the raised drain 150 still remains. As shown in FIGS. 1A and 1B, the side-wall of the fin-type silicon layer 120 is oxidized to form gate oxide layer 170. A poly Si—Ge layer (not shown) is formed over the substrate 100 to fill a space 190 between the spacers 160. Then, the poly Si—Ge layer is patterned to form a gate 180.

Since the electron beam photolithography is used in the method for manufacturing fin-type FET to define the fin-type silicon layer 120, the width of the fin-type silicon layer 120 can be scaled down to about 20~50 nm in order to prevent the device from leakage. Moreover, as shown in FIGS. 1A and 1C, because electric field induced by the gate 180 is passing through both side-walls of the fin-type silicon layer 120, the on-current of the device is relatively large. Nevertheless, because of the use of the SOI substrate, the cost of the device is high. Besides, during the formation of the spacer on the side-wall of the raised source and the raised drain, the side-wall of the fin-type silicon layer is damaged by the over-etch process so that the surface quality of the channel is poor and the performance of the device is worse. Additionally, it is hard to control the condition for forming the raised source and the raised drain to reduce source/drain resistance. Furthermore, since the width of the fin-type silicon layer 120 of the fin-type FET is relatively small in order to block the leakage, it is necessary to use the uncommon electron beam photolithography and the subsequent anisotropic etching process is hard to controlled and will damage the fin surface.

SUMMARY OF THE INVENTION

The invention provides a MOSFET structure with relatively less leakage phenomenon and relatively large on-current.

The invention also provide a method for manufacturing a MOSFET to decrease the leakage in the device and to increase the on-current of the device.

The MOSEFT provided by the invention comprises a substrate, an insulating layer, a spacer, a doped semiconductive layer, a gate dielectric layer, a gate and a source/drain region. The substrate possesses a trench formed therein. The insulating layer is located at the bottom of the trench. The spacer is located on the side-wall of the trench. The doped semiconductive layer spans the trench and partially covers the trench. The gate dielectric layer is located on the top surface and the bottom surface of the doped semiconductive layer. The gate is located on the gate dielectric layer, wherein the gate surrounds a portion of the doped semiconductive layer over the trench. The source/drain region is located in the substrate adjacent to the portion of the doped semiconductive layer surrounded by the gate.

The method for manufacturing a MOSFET provided by this invention comprises the steps of providing a substrate. A trench filled with an insulating layer is formed in the substrate. The upper portion of the insulating layer is removed, and a spacer is formed on the side-wall of the trench. A sacrificial layer is formed to fill the trench. A doped semiconductive layer is formed over the substrate. The doped semiconductive layer is patterned to form a device region, wherein the device region spans the sacrificial layer to expose a portion of the sacrificial layer. The sacrificial layer is removed. A gate dielectric layer is formed on the top surface and the bottom surface of the device region. A conductive layer is formed on the gate dielectric layer. The conductive layer is patterned to form a horizontal surround gate surrounding the channel region. A source/drain region is formed in a portion of the substrate adjacent to the channel region.

In the present invention, because the extra-thin doped semiconductive layer is used as a channel region, there is no channel portion far from the gate. Moreover, since the horizontal surround gate surrounds the channel region, the channel region is well controlled by the electric field. Therefore, the leakage can be greatly decreased and the on-current can be largely increased. Besides, the extra-thin doped semiconductive layer replaces the conventional SOI film to be a channel region, so that the wafer cost can be decreased. Furthermore, by comparing it with the fin-type FET, since the surface of the doped semiconductive layer in the present invention is not exposed by dry etching, the performance of the device won't be affected. Also, the source/drain region is formed by the conventional doping process in the invention. It is not necessary to form the raised source/drain. Therefore, the manufacturing process can be well controlled. Further, the thickness of the channel region depends on the thickness of the doped semiconductive layer. Therefore, the issues caused by the electron beam lithography and the anisotropic etching process can be totally solved.

In addition, since there is a spacer between the gate and the source/drain region beside the side-wall of the trench, the parasitic capacitance between the gate and the source/drain region can be quite small. Similarly, since there is an insulating layer between the gate and the bottom of the trench, the parasitic capacitance between the gate and the substrate can be quite small.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A through 1C are schematics of the structure of a fin-type FET, wherein FIG. 1B is a cross-sectional view of a portion of FIG. 1A along line I–I' and FIG. 1C is a cross-sectional view of a portion of FIG. 1A along line II–II';

FIGS. 2A, 5A, 6A and 8A are the top views of FIGS. 2, 5, 6 and 8, respectively, wherein FIGS. 2, 5, 6 and 8 are the cross-sectional views of FIGS. 2A, 5A, 6A and 8A along line III–III' on each figure;

DESCRIPTION OF THE PREFERRED EMBODIMENTS

FIGS. 2 through 9 are schematic, cross-sectional views of the process for manufacturing a MOSFET in a preferred embodiment according to the invention.

FIGS. 2A, 5A, 6A and 8A are the top views of FIGS. 2, 5, 6 and 8, respectively. It should be noticed that FIGS. 2, 5, 6 and 8 are the cross-sectional views of FIGS. 2A, 5A, 6A and 8A along line III–III' on each figure. Besides, FIG. 8B is a cross-sectional view of FIG. 8A along line IV–IV'.

Figure 1A:
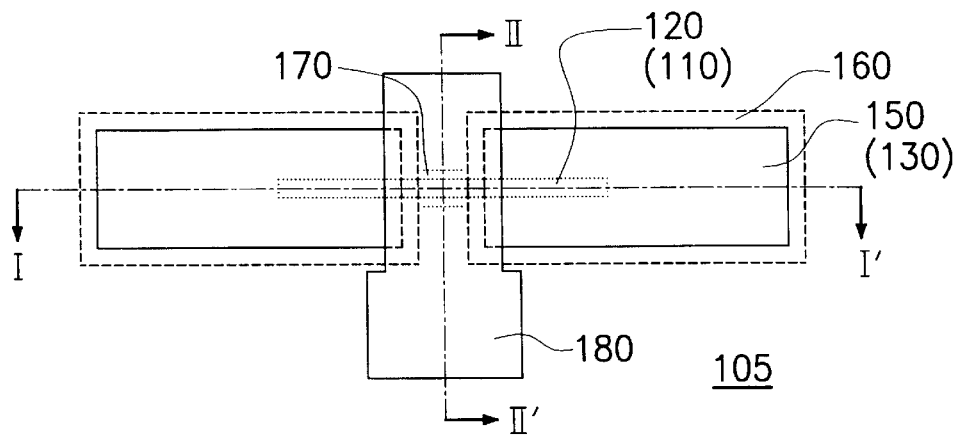
Figure 1B:
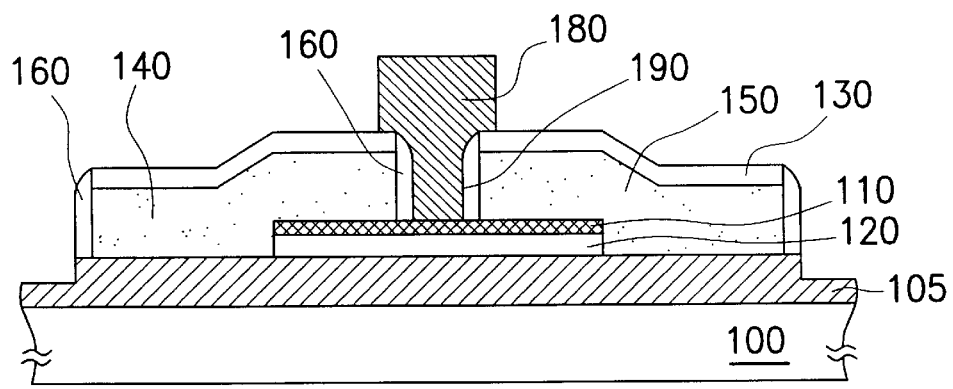
Figure 1C:
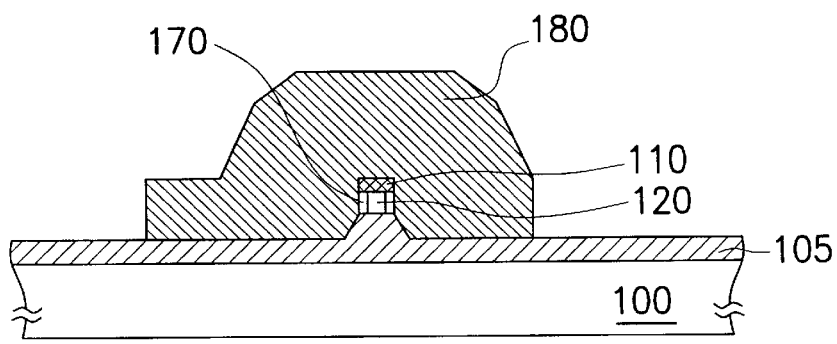
Figure 2A:
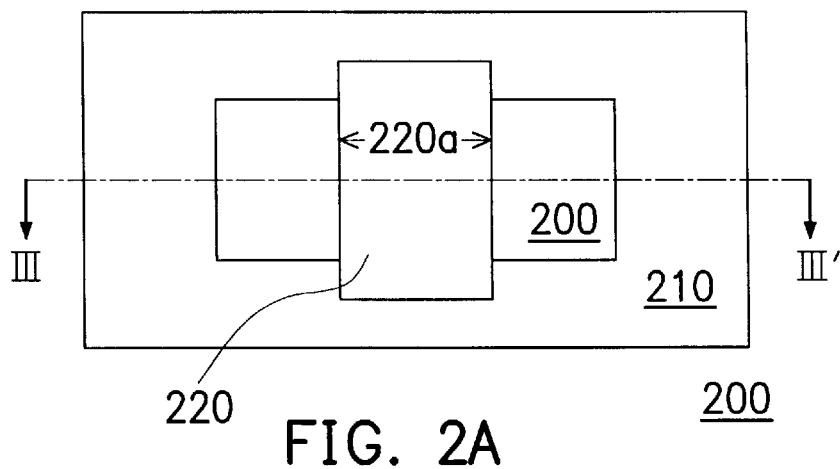
Figure 2:
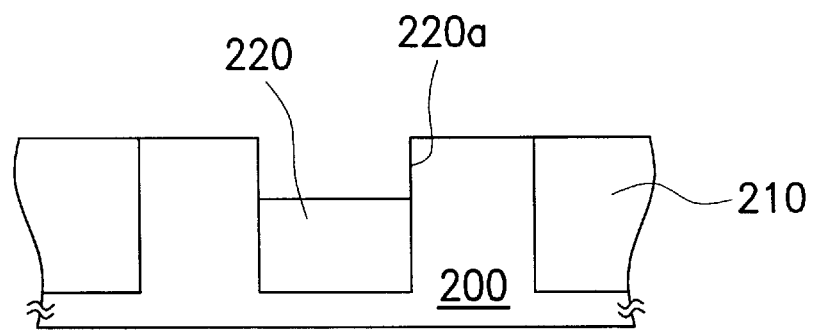
FIGS. 2 through 9 are schematic, cross-sectional views of the process for manufacturing a MOSFET in a preferred embodiment according to the invention.

As shown in FIGS. 2 and 2A, a substrate 200 is provided. The substrate 200 can be a bulky silicon substrate, for example. An annulus-type shallow trench isolation (STI) 210 and a STI 220 at the "future" channel region are formed in the substrate 200. The STI 210 and 220 can be formed from silicon oxide by high density plasma chemical vapor deposition (HDP-CVD), for example. A photolithography and etching process is performed to remove the upper portion of the STI 220 in order to form a trench 220a. Two opposite sides of the trench 220a are extended to the STI 210, as shown in FIG. 2A, and the depth of the trench 220a is about 0.05–0.3 micron.

Figure 3:
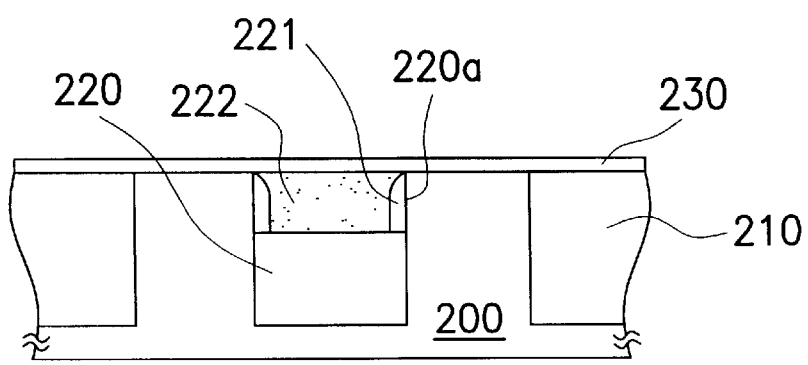

As shown in FIG. 3, a spacer 221 is formed on the side-wall of the trench 220a, then a sacrificial layer 222 is formed to fill the trench 220a. The spacer 221 is made of, for example, silicon oxide and is formed by depositing a conformal silicon oxide layer and then anisotropically etching the silicon oxide layer, wherein the silicon oxide layer is formed by a method such as LPCVD (low pressure chemical vapor deposition). The sacrificial layer 222 is made of the material, such as silicon nitride, different from that of the STI 210 or STI 220 and that of the spacer 221. The method for forming the sacrificial layer 222 comprises the steps of using chemical vapor deposition to form a sacrificial material over the substrate 200 and removing a portion of the sacrificial material by chemical-mechanical polishing process (CMP) to form a sacrificial layer 222. Thereafter, an amorphous semiconductive layer 230 is formed over the substrate. The amorphous semiconductive layer 230 can be an amorphous silicon layer formed by low-pressure chemical vapor deposition (LPCVD), for example. The thickness of the amorphous semiconductive layer 230 is about 1~50 nm.

Figure 4:
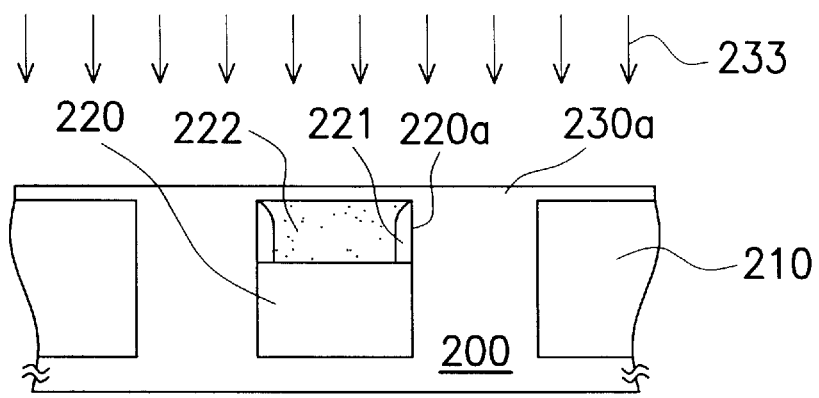

As shown in FIG. 4, a solid phase epitaxy (SPE) process is performed to convert the amorphous semiconductive layer 230 into a crystallized semiconductive layer 230a. When the amorphous semiconductive layer 230 is a single-layer amorphous silicon layer, the temperature of the SPE process is about 500~600° C. and the operation time is about 1–6 hr. A channel implantation process is performed to implant ions 233 into crystallized semiconductor layer 230a. A portion of the crystallized semiconductive layer 230a over the trench 220a is channel region. The dosage of the ions 233 is about $10^{12}$~$6 \times 10^{13}$/cm$^2$. Taking the formation of an NMOS as an example, the ions 233 are P-type ions such as boron ions. On the contrary, the ions 233 are N-type ions such as arsenic ions or phosphorus ions when a PMOS is formed.

Besides, the doped crystallized semiconductive layer 230a mentioned above can be also formed by in-situ doping process. The in-situ doping process comprises the steps of introducing dopants during the deposition of the amorphous semiconductive layer 230 and performing the SPE process to convert the doped amorphous semiconductive layer 230 into the doped crystallized semiconductive layer 230a.

Figure 5:
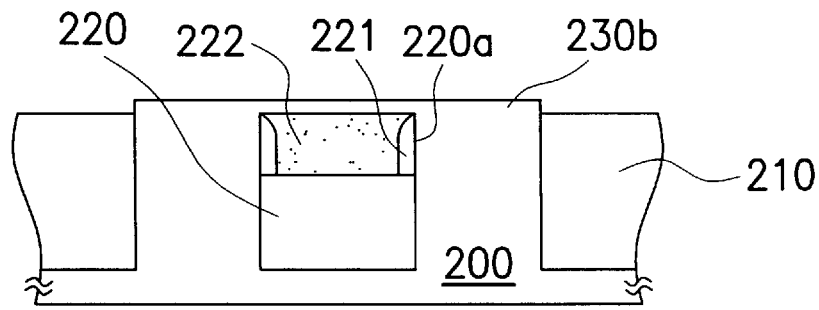
Figure 5A:
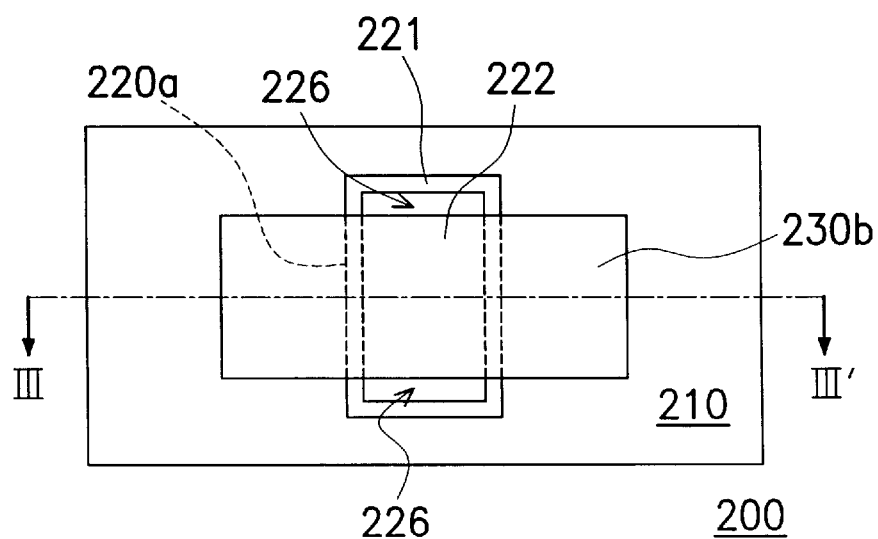

As shown in FIGS. 5 and 5A, the crystallized semiconductive layer 230a is patterned to form a device region 230b covering the central portion of the sacrificial layer 222. The device region 230b and the spacer 221 together constitute narrow spaces 226 to expose the surface area of the sacrificial layer 222 between the device region 230b and the spacer 221.

Figure 6A:
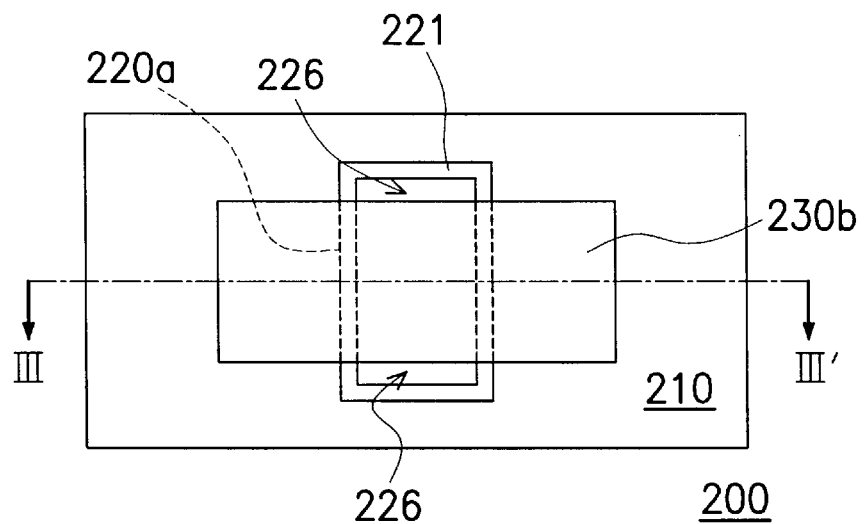
Figure 6:
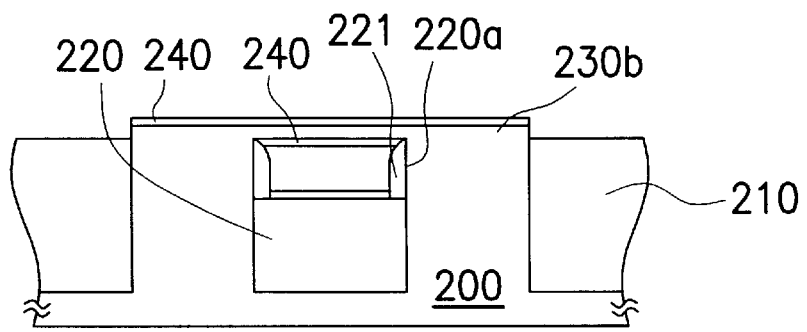

As shown in FIGS. 6 and 6A, the sacrificial layer 222 is removed by isotropic etching process so that the device region 230b spans the trench 220a. The isotropic etching process can be a wet etching and the etchant stripes the sacrificial layer 222 from the trench 220a by passing through the narrow spaces 226, wherein the etching rates of the STI 210 and the spacer 221 are relatively low. When the sacrificial layer 222 is silicon nitride layer, the etchant can be phosphoric acid. A gate dielectric layer 240 is formed on both inner surface of the trench 220a and the surface of the device region 230b. The gate dielectric layer 240 can be a gate oxide layer formed by thermal oxidation process or a nitridized gate oxide layer, for example. It should be noticed that the step for forming the nitridized gate oxide layer comprises forming a gate oxide layer and then performing a nitridization process on the gate oxide layer.

Figure 7:
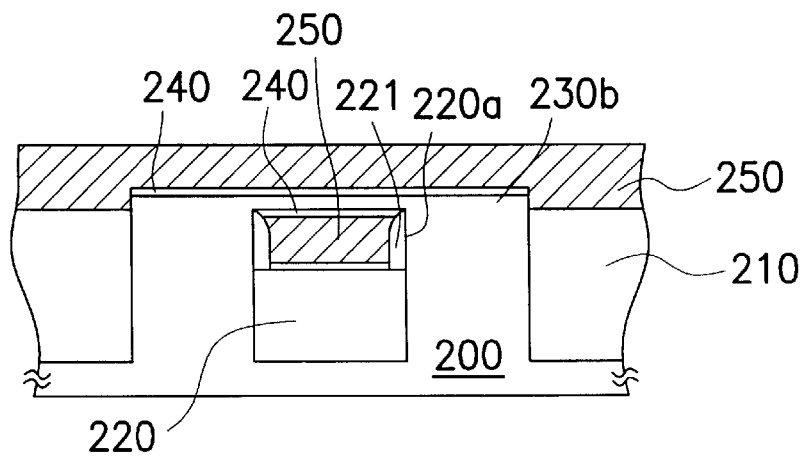

As shown in FIG. 7, a conductive layer 250 is formed over the substrate 200 and to fills the trench 220a. The conductive layer 250 can be a polysilicon layer or a poly Si—Ge layer formed by LPCVD, for example. Alternatively, the conductive layer 250 can be polycide or metal, for example.

Figure 8:
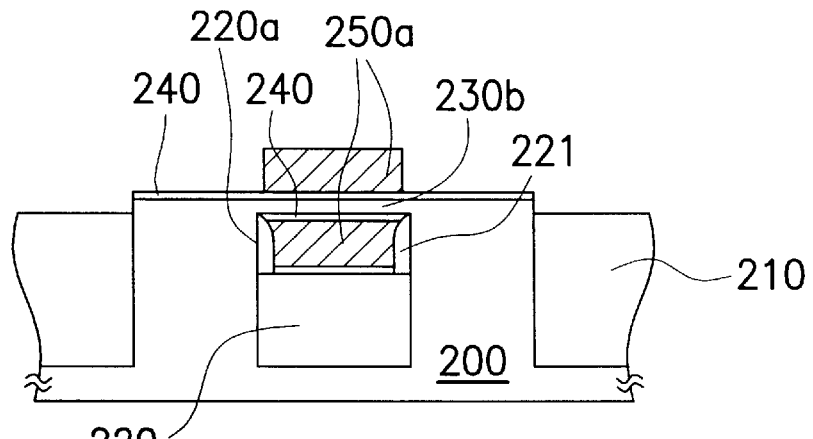
Figure 8A:
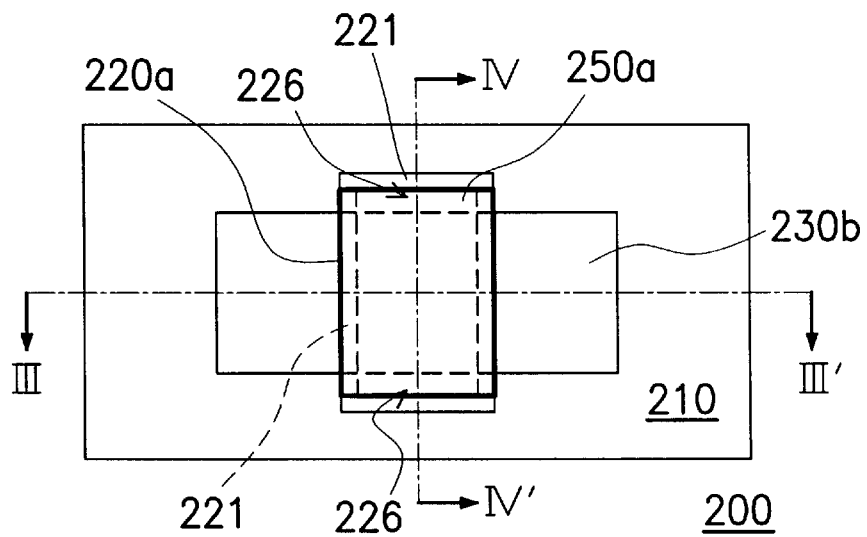
Figure 8B:
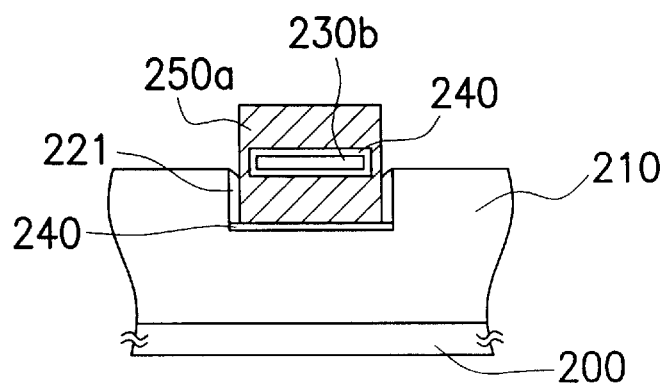
FIG. 8B is a cross-sectional view of FIG. 8A along line IV–IV'.

As shown in FIGS. 8, 8A and 8B, the conductive layer 250 is patterned to form a horizontal surround gate 250a surrounding a portion of the device region 230b over the trench 220a and being isolated from the side-wall of the trench 220a by the spacer 221. The portion of the device region 230b surrounded by the horizontal surround gate 250a is a channel region.

Figure 9:
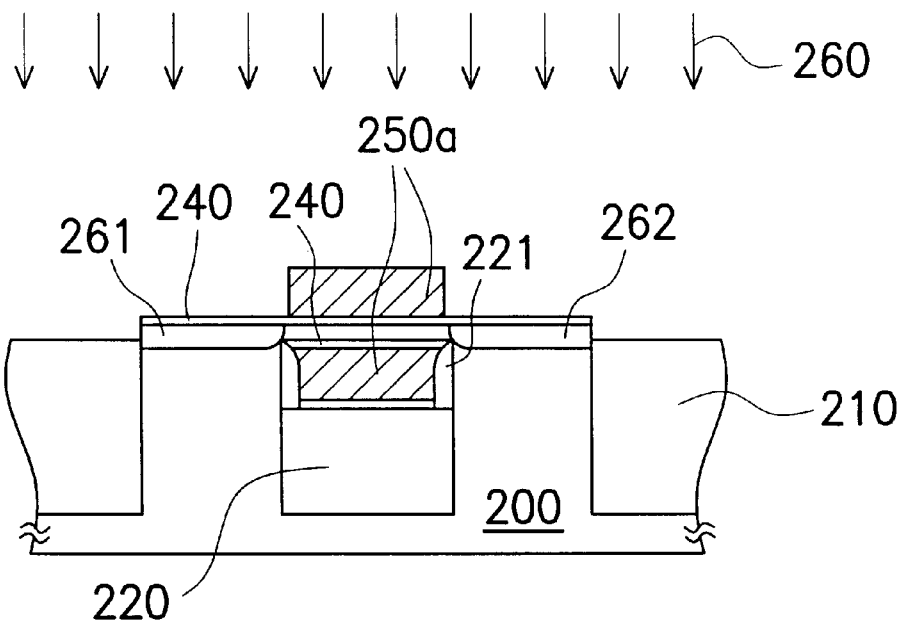

As shown in FIG. 9, a source region 261 and a drain region 262 are formed in the substrate 200 adjacent to the channel region. The method for forming the source region 261 and the drain region 262 comprises an ion implantation process or an diffusion doping process by using the horizontal surround gate 250a as a mask, for example.

Figure 10:
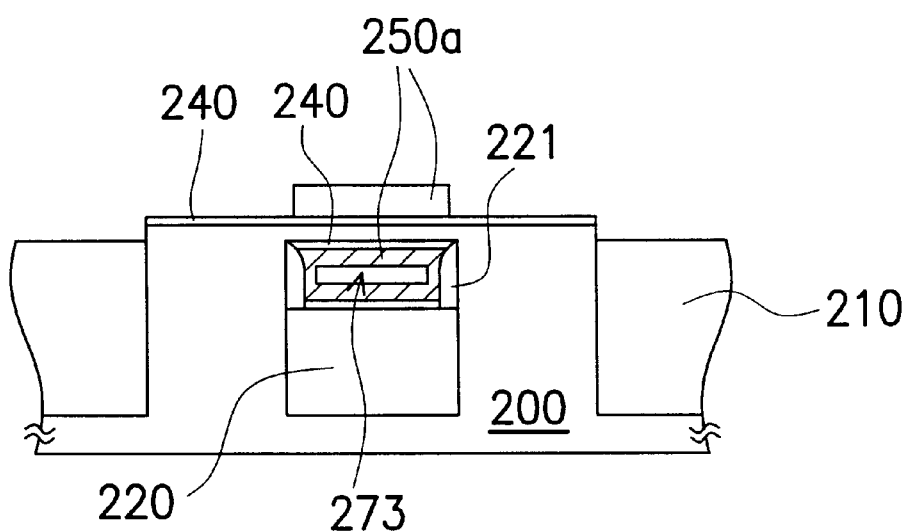
FIG. 10 is a schematic, cross-sectional view of a horizontal surround gate with a hollow gate structure.

As shown in FIG. 10 together with FIGS. 7 and 8, as long as gate dielectric layer 240 on the bottom surface of the device region 230b is covered by the gate 250a, the electric inversion phenomenon will occurs below the device region 230b. Therefore, the portion of the horizontal surround gate 250b under the device region 230b also can be a hollow gate structure with a free space 273 as shown in FIG. 10.

In addition, as shown in FIGS. 3 to 5, the source/drain region can be formed by an ion implantation process right before the amorphous semiconductive layer 230 is formed, while the source region and the drain region are separated by the sacrificial layer 222 and the spacer 221.

In the present invention, because the extra-thin doped semiconductive layer is used as a channel region, there is no channel portion far from the gate. Therefore, the leakage can be dramatically decreased and the on-current can be greatly increased.

Moreover, since the horizontal surround gate surrounds the channel region, the channel region is well controlled by the gate electric field. Hence, the leakage can be dramatically decreased and the on-current can be greatly increased.

Besides, the extra-thin doped crystallized semiconductive layer, such as a epitaxial silicon layer, replaces the conventional SOI film to be a channel region, so that the substrate cost can be decreased.

Furthermore, by comparing with the fin-type FET, since the surface of the doped crystallized semiconductive layer in the present invention is not formed by dry etching, the performance of the device won't be affected.

Also, the source/drain region is formed by the conventional doping process in the invention. It is not necessary to form the raised source/drain. Therefore, the manufacturing process can be well controlled.

Further, the thickness of the channel region depends on the thickness of the doped crystallized semiconductive layer. Therefore, the issues caused by the electron beam and the anisotropic etching process can be totally solved.

In addition, since there is the spacer between the gate and the source/drain region beside the side-wall of the trench, the parasitic capacitance between the gate and the source/drain region can be quite small. Similarly, since there is an insulating layer between the gate and the bottom of the trench, the parasitic capacitance between the gate and the substrate can be quite small.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A MOSFET, comprising:

a substrate having a trench formed therein and a shallow trench isolation region enclosing the trench;

an insulating layer at a bottom of the trench;

a spacer on a side-wall of the trench;

a doped semiconductive layer disposed over the trench and on the substrate, wherein the doped semiconductive layer partially covers the trench, and the shallow trench isolation region encloses the trench and the doped semiconductive layer;

a gate dielectric layer comprising a first portion and a second portion, wherein the first portion is formed on and fully covers a top surface of the doped semiconductive layer and the second portion is formed on and partially covers a bottom surface of the doped semiconductive layer;

a gate comprising a first portion formed on the first portion of the gate dielectric layer, so that the first portion of the gate is disposed above the trench, and a second portion formed on the second portion of the gate dielectric layer, so that the second portion of the gate is disposed in the trench, wherein the first and second portions of the gate formed on the first and second portions of the gate dielectric layer enclose a portion of the doped semiconductive layer that is over the trench; and a source/drain region in the substrate under the doped semiconductive layer and formed on either side of the gate by ion implantation or diffusion doping using the gate as a mask, wherein the shallow trench isolation region abuts the source/drain region.

2. The MOSFET of claim 1, wherein the doped semiconductive layer includes a doped crystallized semiconductive layer.

3. The MOSFET of claim 2, wherein the doped crystallized semiconductive layer includes a doped epitaxial silicon layer.

4. The MOSFET of claim 3, wherein the thickness of the doped epitaxial silicon layer is about 1~50 nm.

5. The MOSFET of claim 1, wherein the second portion of the gate in the trench is a solid structure.

6. The MOSFET of claim 1, wherein the second portion of the gate in the trench is a hollow structure.

7. The MOSFET of claim 1, wherein the doped semiconductive layer covers a central portion of the trench.

8. The MOSFET of claim 1, wherein the spacer comprises silicon oxide.

9. The MOSFET of claim 1, wherein the gate dielectric layer includes a gate oxide layer.

10. The MOSFET of claim 1, wherein the gate dielectric layer includes a nitridized gate oxide layer.

11. The MOSFET of claim 1, wherein the gate is formed from polysilicon.

12. The MOSFET of claim 1, wherein the gate is formed from poly Si—Ge.

13. The MOSFET of claim 1, wherein the gate is formed from polycide.

14. The MOSFET of claim 1, wherein the gate is formed from metal.

15. The MOSFET of claim 1, wherein a distance between a top surface of the insulating layer and a bottom surface of the doped semiconductive layer is about 0.05–0.3 micron.

* * * * *